United States Patent
Chang et al.

(10) Patent No.: US 7,034,331 B2
(45) Date of Patent: Apr. 25, 2006

(54) MATERIAL SYSTEMS FOR SEMICONDUCTOR TUNNEL-JUNCTION STRUCTURES

(75) Inventors: Ying-Lan Chang, Cupertino, CA (US); Ashish Tandon, Sunnyvale, CA (US); Michael H. Leary, Union City, CA (US); Michael R. T. Tan, Menlo Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 19 days.

(21) Appl. No.: 10/861,144

(22) Filed: Jun. 4, 2004

(65) Prior Publication Data
US 2004/0217343 A1 Nov. 4, 2004

Related U.S. Application Data

(63) Continuation of application No. 10/243,520, filed on Sep. 12, 2002, now Pat. No. 6,765,238.

(51) Int. Cl.
*H01L 29/06* (2006.01)

(52) U.S. Cl. ............... 257/25; 257/13; 257/79; 257/103; 257/104; 257/183; 257/918; 438/22; 438/24; 438/25; 438/28; 438/29; 438/46; 438/47

(58) Field of Classification Search ............ None
See application file for complete search history.

(56) References Cited

U.S. PATENT DOCUMENTS

| 5,679,963 | A | * | 10/1997 | Klem et al. ............ 257/46 |
| 5,944,913 | A | * | 8/1999 | Hou et al. ............ 136/255 |
| 6,372,980 | B1 | * | 4/2002 | Freundlich ............ 136/255 |
| 2002/0090016 | A1 | * | 7/2002 | Coldren et al. .......... 372/96 |

OTHER PUBLICATIONS

Ortsiefer, Markus, "Low Resistance InGa(Al) as Tunnel Junctions for Long Wavelength Vertical-Cavity Surface-Emitting Lasers", Jpn J. Appl. Phys. Vol. 39 (2000), pp. 1727-1729.

* cited by examiner

*Primary Examiner*—Andy Huynh
(74) *Attorney, Agent, or Firm*—Ian Hardcastle

(57) ABSTRACT

The tunnel junction structure comprises a p-type tunnel junction layer of a first semiconductor material, an n-type tunnel junction layer of a second semiconductor material and a tunnel junction between the tunnel junction layers. At least one of the semiconductor materials includes gallium (Ga), arsenic (As) and either nitrogen (N) or antimony (Sb). The probability of tunneling is significantly increased, and the voltage drop across the tunnel junction is consequently decreased, by forming the tunnel junction structure of materials having a reduced difference between the valence band energy of the material of the p-type tunnel junction layer and the conduction band energy of the n-type tunnel junction layer.

35 Claims, 6 Drawing Sheets

MATERIAL SYSTEMS FOR SEMICONDUCTOR TUNNEL-JUNCTION STRUCTURES

This application is a Continuation of U.S. patent application Ser. No. 10/243,520, filed Sep. 12, 2002 now U.S. Pat. No. 6,765,238 the entire disclosure of which is incorporated herein by reference.

BACKGROUND OF THE INVENTION

Semiconductor lasers generate light that can be used in optical communication systems, compact disc (CD) players, digital videodisc (DVD) players, scanners and other systems. Semiconductor lasers for optical communications include quantum-cascade lasers, vertical-cavity surface-emitting lasers (VCSELs), edge-emitting lasers, in-plane emitting lasers and the like.

Until recently, relatively expensive Fabry-Perot (FP) and distributed-feedback (DFB) lasers have been used to generate light at the wavelengths presently used in the telecommunication industry for transmission via fiber-optic links. Although VCSEL technology has proven to be a viable lower-cost, lower-power alternative well suited for short-haul network applications, the industry has had difficulty to produce reliable, cost-effective VCSELs for use at the longer wavelengths used in medium- and long-haul fiber-optic communications links.

A VCSEL is composed of an active region sandwiched between vertically-stacked mirrors, commonly known as distributed Bragg reflectors (DBRs) or Bragg mirrors. The active region typically includes quantum wells that generate the light. The quantum wells are composed of thin layers of semiconductor materials that differ in band-gap energy. To achieve the necessary reflectivity, the number of semiconductor or dielectric layers constituting each of the DBRs can be quite large. The VCSEL emits the light generated in the active region through one of the mirrors, which has a reflectivity less than that of the other of the mirrors. Light is output from a VCSEL from a relatively small area on the surface of the semiconductor, directly above or below the active region.

The potential for VCSELs to generate light with relatively long wavelengths has not been realized due, in part, to the difficulty of epitaxially growing DBRs that have suitable optical, electrical, and thermal properties on an indium phosphide (InP) substrate. Two of the more significant problems are high optical losses and high joule heating in the Bragg mirror fabricated using p-type semiconductor materials.

The industry has explored incorporating a tunnel junction into a VCSEL to address these problems. Incorporating a tunnel junction allows both DBRs to be fabricated using n-type semiconductor materials. A DBR fabricated using n-type semiconductor materials has significantly lower optical losses and higher electrical conductivity than a DBR fabricated using p-type semiconductor material. Reduced optical losses lead to a lower threshold current and a correspondingly higher differential gain. Higher differential gain is an important parameter for achieving high-bandwidth modulation. High-bandwidth modulation is desirable for optical fiber-based communication systems.

FIG. 1 shows a side view of an example of a prior-art semiconductor device 100 incorporating a tunnel junction structure 102. The tunnel junction structure is composed of an n-type tunnel junction layer 104, a p-type tunnel junction layer 106 and a tunnel junction 110 between the tunnel junction layers. The n-type tunnel junction layer is a layer of an n-type semiconductor material. The p-type tunnel junction layer is a layer of a p-type semiconductor material. Applying a reverse bias across tunnel junction 110 will cause a tunneling current to flow across the tunnel junction. A reverse bias is applied by setting n-type tunnel junction layer 104 to a more positive voltage than p-type tunnel junction layer 106. It is desirable to minimize the voltage drop across the tunnel junction to reduce the overall voltage drop across the VCSEL. To minimize the voltage drop across the tunnel junction, conventional approaches have focused on maximizing the doping concentrations in the materials of the tunnel junction layers.

Also shown in FIG. 1 are n-type layer 102 on which n-type tunnel junction layer 104 is grown and p-type layer 108 grown on p-type tunnel junction layer 106. N-type layer 102 may constitute the substrate of semiconductor device 100. Alternatively, n-type layer 102 may be grown on or over the substrate.

Many different pairs of semiconductor materials that can be used as the materials of n-type tunnel junction layer 104 and of p-type tunnel junction layer 106 are known in the art. In the semiconductor device 100 illustrated in FIG. 1, the semiconductor material of n-type tunnel junction layer 104 is n-type indium phosphide (InP) and the semiconductor material of p-type tunnel junction layer 106 is indium gallium aluminum arsenide (InGaAlAs). The material of layer 102 is also n-type InP that has a lower dopant concentration than the material of n-type tunnel junction layer 104. The material of layer 108 is also p-type InGaAlAs that has a lower dopant concentration than the material of p-type tunnel junction layer 106.

Tunnel junctions having a low voltage drop are formed of materials that establish a large built-in electrostatic field across the tunnel junction. A large electrostatic field requires a large potential difference across a short distance, and is typically generated by using very high doping concentrations in the tunnel junction layers that minimize the width of the depletion region at the tunnel junction.

FIGS. 2A and 2B each include an energy diagram 200 and an electrical circuit model 202 that show some of the characteristics of tunnel junction structure 102. FIG. 2A shows the characteristics of the tunnel junction structure at equilibrium. FIG. 2B shows the characteristics of the tunnel junction structure under reverse bias. Each energy diagram shows the conduction band energy $E_{Cn}$ and the valence band energy $E_{Vn}$ of the semiconductor material of n-type tunnel junction layer 104. Each energy diagram also shows the conduction band energy $E_{Cp}$ and the valence band energy $E_{Vp}$ of the semiconductor material of p-type tunnel junction layer 106. N-type tunnel junction layer 104 and p-type tunnel junction layer 106 collectively form tunnel junction 110.

The energy diagram of FIG. 2A shows the depletion region 204 that exists at tunnel junction 110 at equilibrium. At equilibrium, the Fermi level $E_{Fn}$ of the material of n-type tunnel junction layer is equal to the Fermi level $E_{Fp}$ of the material of p-type tunnel junction layer 106. The conduction bands of the materials of the tunnel junction layers differ in energy, which establishes the built-in potential barrier 206 at the tunnel junction that prevents conduction through the tunnel junction at low forward bias. The electrostatic field strength E at the tunnel junction depends on the height of the built-in potential barrier and depends inversely on the width W of the depletion region 204 at the tunnel junction.

A forward bias applied across tunnel junction 110 decreases the height of the built-in potential barrier at the tunnel junction. Sufficient forward bias causes current to flow across the tunnel junction in the forward direction. A forward bias is established by setting p-type tunnel junction layer 106 to a more positive voltage than n-type tunnel junction layer 104. The width of depletion region 204 decreases under forward bias (not shown).

A reverse bias applied across tunnel junction 110 adds to the height of the built-in potential barrier and increases the width of depletion region 204 to W'. The reverse bias separates the Fermi levels $E_{Fn}$ and $E_{Fp}$ on opposite sides of the tunnel junction. In the example shown, the Fermi level $E_{Fp}$ of the material of p-type tunnel junction layer 106 has increased relative to its equilibrium level, whereas the Fermi level $E_{Fn}$ of the material of n-type tunnel junction layer 104 remains substantially unchanged. In a conventional p-n junction, only a small leakage current flows across the junction under reverse bias. However, in tunnel junction 110, the reverse bias causes current to flow occurs due to electrons tunneling through the potential barrier.

The reverse bias elevates the valence band energy $E_{Vp}$ of the material of p-type tunnel junction layer 106 above the conduction band energy $E_{Cn}$ of the material of n-type tunnel junction layer 104. This allows electrons in the valence band of the material of the p-type tunnel junction layer to tunnel through the potential barrier to unoccupied sites in the conduction band of the material of n-type tunnel junction layer 104, as shown schematically in FIG. 2B. The greater the reverse bias applied across tunnel junction 110, the higher the probability that an electron, e$^-$, will tunnel across tunnel junction 110, and the higher the conduction through the tunnel junction.

In conventional tunnel junction structure 100, the semiconductor materials of tunnel junction layers 104 and 106 have a relatively large band-gap energy difference. Such materials establish a relatively high potential barrier at tunnel junction 110. The reverse bias that has to be applied across the tunnel junction structure to cause a tunneling current of the order of the laser current of a laser diode to flow is therefore relatively large. Such a tunnel junction can therefore be regarded as having a high voltage drop, which is undesirable in many applications. The voltage drop of a tunnel junction structure can be reduced by reducing the width of the depletion region to increase the tunneling probability. This approach is conventionally used to reduce the voltage drop by doping the tunnel junction layers at as high a doping concentration as possible.

The dopant concentrations required to obtain an acceptably low voltage drop may be so high that dopant precipitation occurs. Dopant precipitation degrades the crystallinity of the material of at least one of the tunnel junction layers, and, hence, the optical properties of the material. Obtaining a narrow depletion region also requires low interdiffusion, and therefore, low-temperature processing. Low-temperature processing can degrade the optical properties of the material. Moreover, high doping concentrations successfully achieved when the n-type tunnel junction layer is grown may reduce by diffusion during subsequent high-temperature processing, e.g., when the p-type tunnel junction layer and/or the DBR are grown. Tunnel junctions obtained by maximizing doping concentrations are often unstable in use because of post-manufacture dopant diffusion.

Materials with a low band-gap may be used as the semiconductor materials of n-type tunnel junction layer 104 and p-type tunnel junction layer 106 to reduce the doping concentrations necessary to achieve a given conductivity. Low band-gap materials, such as indium gallium arsenide (InGaAs, $E_g$=0.75 eV), have been used in InP-based devices, i.e., semiconductor devices with substrates of indium phosphide, to achieve a relatively high tunnel-junction conductivity.

For example, tunnel junction structure 102 shown in FIG. 1 can be formed with n-type tunnel junction layer 104 of n-type indium phosphide (InP) and p-type tunnel junction layer 106 of p-type indium gallium arsenide (InGaAs) forming InGaAs/InP-tunnel junction 110. Additionally, in this example, the material of layer 102 is n-type InP and the material of layer 108 is p-type InGaAs, with doping concentrations less than those of the materials of the tunnel junction layers.

InGaAs is optically absorbing due to its low band gap. Consequently, a laser incorporating a tunnel junction structure having InGaAs as the material of p-type tunnel junction layer 106 does not provide good results as the InGaAs absorbs most of the light generated in the active region of the device.

Another known combination of materials that may be used to form tunnel junction structure 102 is n-type InP as the semiconductor material of n-type tunnel junction layer 104 and p-type aluminum indium gallium arsenide (AlInGaAs) as the semiconductor material of p-type tunnel junction layer 106. In this combination, the mole fractions of the constituent elements of the AlInGaAs of p-type tunnel junction layer 106 are chosen to give a lattice constant that matches the lattice constant of the InP of n-type tunnel junction layer 104. As in the tunnel junction structures described above, the material of substrate 102 is n-type InP and the material of layer 108 is p-type AlInGaAs with doping concentrations less than those of the materials of the tunnel junction layers.

As mentioned above, the materials of tunnel junction layers 104 and 106 have high doping concentrations to achieve high tunneling probabilities and a high conductivity. Because intermixing of the n-type and the p-type dopants tends to reduce the effective doping concentration in each of the layers, it is desirable to keep the junction abrupt. Carbon doping is attractive for this purpose due to its low diffusion coefficient. Although carbon doping in InGaAs has been widely demonstrated, various problems remain in achieving high concentrations of carbon doping for AlInGaAs. For example, carbon tetrachloride is used as the source of the carbon dopant when AlInGaAs is grown using metal-organic chemical vapor deposition (MOCVD). A high flow rate of carbon tetrachloride is used to increase the depth of carbon incorporation into the AlInGaAs. Etching of the grown material by the carbon tetrachloride decreases the precision with which the thickness of the AlInGaAs layer can be controlled.

Another important drawback in tunnel junction structures in which the material of p-type tunnel junction layer 106 is InGaAs or AlInGaAs is the high degree of hydrogen passivation of the dopants in the materials. Up to 80% of the incorporated carbon can be hydrogen passivated in such materials. Hydrogen passivation reduces the available hole concentration, although a post-growth anneal can be used to reverse some of the hydrogen passivation and provide a higher active hole concentration.

Another known combination of materials suitable for forming tunnel junction structure 102 forms p-type tunnel junction layer 106 with a superalloy structure to increase carbon incorporation. The material of n-type tunnel junction layer 104 is n-type indium phosphide (InP), as in the examples described above. The material of p-type tunnel junction layer 106 is a p-type "InAs/AlGaAs superalloy" composed of a number pairs of thin layers of p-type semiconductor materials. In one example, each layer pair is composed of a 1.6 nm-thick layer of $Al_{0.1}Ga_{0.9}As$ and a 1.7 nm-thick layer of InAs.

The combination of materials just described provides a hole concentration of $3\times10^{19}$ cm$^{-3}$. However, the oxygen concentration was about $10^{19}$ cm$^{-3}$, probably due to the use of an aluminum source at low growth temperatures. Oxygen atoms in a semiconductor material generally form deep-level, non-radiative recombination centers. Additionally, oxygen tends to degrade the semiconductor material and can compensate the dopant, which reduces the conductivity of the material. Consequently, high oxygen concentrations are undesirable.

Thus, what is needed is a tunnel junction structure in which the tunneling probability is increased and, hence, the conductivity of the tunnel junction structure is increased and the voltage drop across the tunnel junction structure is reduced.

SUMMARY OF THE INVENTION

The invention provides a tunnel junction structure that comprises a p-type tunnel junction layer of a first semiconductor material, an n-type tunnel junction layer of a second semiconductor material and a tunnel junction between the tunnel junction layers. At least one of the semiconductor materials includes gallium (Ga), arsenic (As) and either nitrogen (N) or antimony (Sb).

The invention also provides a light-emitting device that comprises an active region configured to generate light in response to injected charge and a tunnel junction structure located to inject charge into the active region. The tunnel junction structure includes a p-type tunnel junction layer of a first semiconductor material, an n-type tunnel junction layer of a second semiconductor material and a tunnel junction between the tunnel junction layers. At least one of the semiconductor materials includes gallium, arsenic and either nitrogen or antimony.

The invention additionally provides a method of making a tunnel junction structure. In the method, a substrate is provided. A first tunnel junction layer of a first semiconductor material is formed over the substrate. A second tunnel junction layer of a second semiconductor material juxtaposed with the first tunnel junction layer is formed to form the tunnel junction. At least one of the first semiconductor material and the second semiconductor material includes gallium, arsenic and either nitrogen or antimony.

Finally, the invention provides a method for generating light. In the method, an optical cavity is formed and an active region is located in the optical cavity. The active region is configured to generate light in response to injected current. A tunnel junction structure is formed located to inject charge into the active region, and current is injected into the active region using the tunnel junction structure. The tunnel junction structure is formed by forming a first tunnel junction layer of a first semiconductor material and forming a second tunnel junction layer of a second semiconductor material. The second tunnel junction is juxtaposed with the first tunnel junction layer to create a tunnel junction. At least one of the first semiconductor material and the second semiconductor material includes gallium, arsenic and either antimony or nitrogen.

The invention provides tunnel junction structures that have a substantially reduced voltage drop by forming the tunnel junction structure of a p-type tunnel junction layer and an n-type tunnel junction layer of semiconductor materials selected to have a reduced difference between the valence band energy of the material of the p-type tunnel junction layer and the conduction band energy of the material of the n-type tunnel junction layer. Reducing this energy difference increases the tunneling probability at a given reverse bias, and, hence, reduces the voltage drop across the tunnel junction for a given current through the tunnel junction.

Specifically, replacing a fraction of the arsenic atoms with antimony atoms in the semiconductor material of the p-type tunnel junction layer increases the valence band energy of this material. Increasing the valence band energy of the semiconductor material of the p-type tunnel junction layer decreases the difference between the valence band energy of the p-type tunnel junction layer and the conduction band energy of the n-type tunnel junction layer. Additionally or alternatively, replacing a fraction of the arsenic atoms with nitrogen atoms in the semiconductor material of the n-type tunnel junction layer decreases the conduction band energy of this material. Decreasing the conduction band energy of the semiconductor material of the n-type tunnel junction layer decreases the difference between the valence band energy of the material of the p-type tunnel junction layer and the conduction band energy of the material of the n-type tunnel junction layer. Reducing this energy difference increases the tunneling probability at a given reverse bias, and, hence, reduces the voltage drop across the tunnel junction for a given current through the tunnel junction.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

The invention provides a tunnel junction structure in which the probability of tunneling is significantly increased by forming the tunnel junction structure of materials having a reduced energy difference between the valence band of the material of the p-type tunnel junction layer and the conduction band of the n-type tunnel junction layer. Typically, the tunnel junction structure of the invention is formed between layers of materials whose energy bands have a Type-II alignment, although not all materials that can be used to make a tunnel junction structure according to the invention have this property. The reduced energy difference means that a high tunneling probability and consequent low voltage drop can be obtained at doping concentrations below the maximum. Accordingly, the performance disadvantages that stem from maximizing doping concentrations are avoided.

Figure 1:
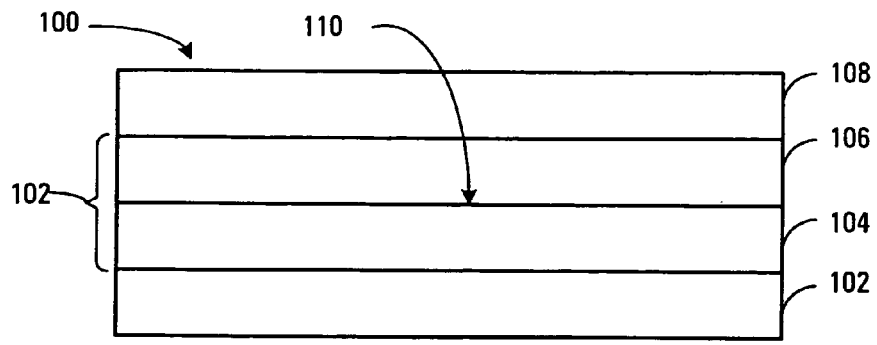
FIG. 1 is a schematic side view of a prior-art semiconductor device incorporating a tunnel junction structure.
Figure 2A:
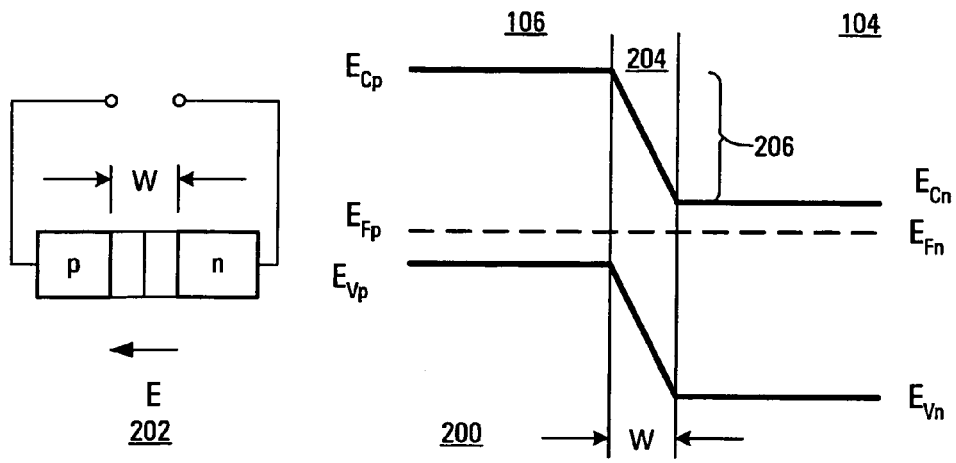
FIGS. 2A and 2B are circuit schematics and associated energy diagrams illustrating characteristics of a tunnel junction structure at equilibrium and under reverse bias, respectively.
Figure 2B:
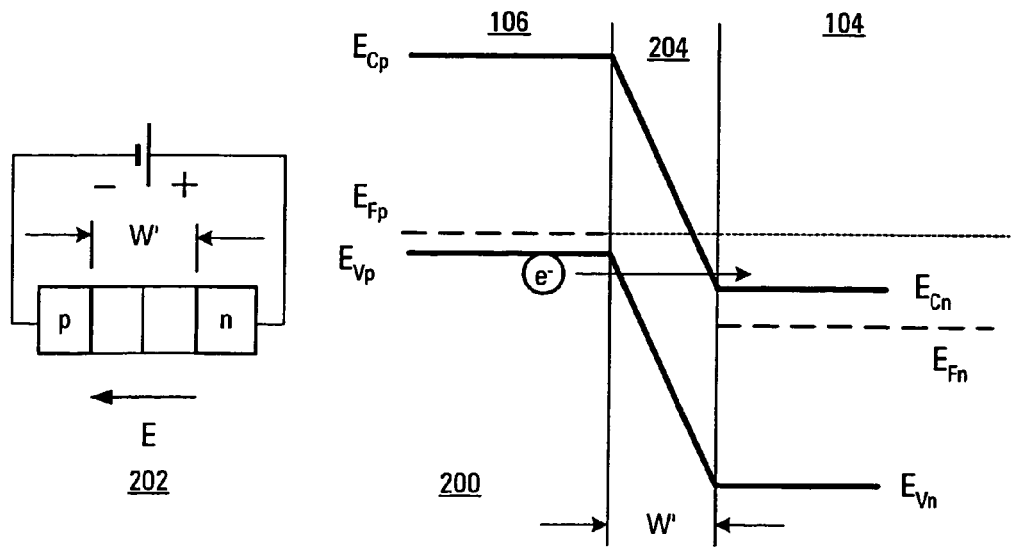
Figure 3:
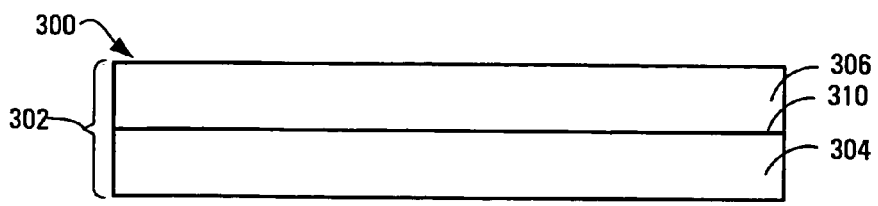
FIG. 3 is a schematic side view of a tunnel junction structure according to the invention.

FIG. 3 is a schematic side view of a semiconductor device 300 incorporating a tunnel junction structure 302 according to the invention. Tunnel junction structure 302 is composed an n-type tunnel junction layer 304, a p-type tunnel junction layer 306 and a tunnel junction 310 between the tunnel junction layers. N-type tunnel junction layer 304 is a layer of an n-type semiconductor material. P-type tunnel junction layer is a layer of a p-type semiconductor material. The semiconductor material of at least one of the tunnel junction layers includes gallium, arsenic and either nitrogen or antimony. Specifically, the semiconductor material of the p-type tunnel junction layer includes gallium, arsenic and antimony. Additionally or alternatively, the semiconductor material of the n-type tunnel junction layer includes gallium, arsenic and nitrogen.

Replacing a fraction of the arsenic atoms with antimony atoms in the semiconductor material of p-type tunnel junction layer 306 increases the valence band of the material. Increasing the valence band energy of the semiconductor material of the p-type tunnel junction layer decreases the difference between the valence band energy of the material of p-type tunnel junction layer 306 and the conduction band energy of the material of n-type tunnel junction layer 304. Additionally or alternatively, replacing a fraction of the arsenic atoms with nitrogen atoms in the semiconductor material of n-type tunnel junction layer 304 decreases the conduction band energy of the material. Decreasing the conduction band energy of the semiconductor material of the n-type tunnel junction layer decreases the difference between the valence band energy of the material of p-type tunnel junction layer 306 and the conduction band energy of the material of n-type tunnel junction layer 304. The measures just described, used singly or in combination, increase the probability of tunneling occurring at a given reverse bias applied across the tunnel junction.

In one embodiment of tunnel junction structure 302, the semiconductor material of p-type tunnel junction layer 306 is p-type gallium arsenide antimonide (GaAsSb) and the semiconductor material of n-type tunnel junction layer 304 is n-type indium phosphide (InP). The conduction band discontinuity between these materials at tunnel junction 310 ranges from about 0.18–0.23 eV, as determined by photoluminescence measurements of the Type-II recombination at the tunnel junction. Significant improvements in many aspects of performance have been observed in tunnel junction structures fabricated from this combination of materials.

In contrast to prior art tunnel junction structures, such as those described above, in which the semiconductor material of the p-type tunnel junction layer is AlInGaAs, hole concentrations up to $1.3 \times 10^{20}$ cm$^{-3}$ can be achieved in p-type tunnel junction layer 306 of GaAsSb. Hydrogen passivation is negligible and post-growth annealing is unnecessary for dopant activation. A high carbon-tetrachloride flow rate is not required due to the high incorporation efficiency of the carbon dopant in GaAsSb. Thus, etching effects are negligible and the layer thickness can be precisely controlled. Doped GaAsSb can be grown lattice matched or pseudomorphically to InP by metallo-organic chemical-vapor deposition (MOCVD) at a temperature in the range from 500° C. to 600° C. In addition, the oxygen level can be as low as $10^{16}$ cm$^{-3}$ in this material.

Gallium arsenide antimonide in which the antimony fraction is about 0.49 is lattice matched to indium phosphide. The band-gap of gallium arsenide antimonide in which the antimony fraction is about 0.49 is about 0.8 eV. This material therefore absorbs light of wavelengths greater than about 1.3 µm. This wavelength range includes the wavelengths from 1.3 µm to 1.6 µm used in medium- and long-haul telecommunications. When a tunnel junction structure that includes this material is incorporated in a light-emitting device such as a VCSEL, one way to reduce this absorption is to place tunnel junction at the minimum of the electromagnetic field intensity distribution in the light-emitting device.

Another way to reduce absorption is to use for the material of p-type tunnel junction layer 306 a material that has a band gap energy sufficiently high to avoid absorption of the light generated in the active region and that has a band gap energy that differs from that of the material of n-type tunnel junction layer 304 by a difference sufficiently small to provide an acceptably-high tunneling probability. The antimony fraction can be used to control these parameters in GaAsSb, for example.

Figure 4:
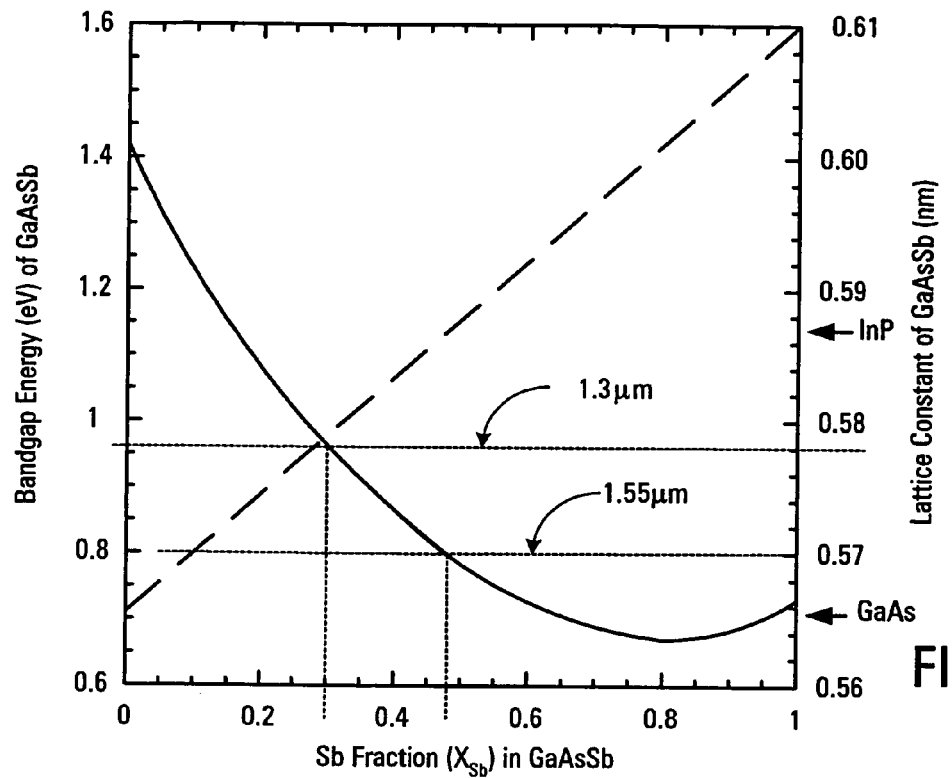
FIG. 4 is a graph illustrating the dependence of the band gap energy and lattice constant of GaAsSb on the Sb fraction.

FIG. 4 is a graph showing the dependence of the band-gap energy and lattice constant of GaAsSb on the fraction $X_{Sb}$ of antimony in the material. FIG. 4 shows that, in a light-emitting device that generates light having a wavelength of 1.5 µm, absorption can be eliminated by using GaAsSb with an antimony fraction of less than about 0.47, i.e., GaAs$_{0.53}$Sb$_{0.47}$, as the material of p-type tunnel junction layer 306. GaAsSb with an antimony fraction of about 0.47 is nearly lattice matched to InP, so that strain between the GaAsSb p-type tunnel junction layer and the InP n-type tunnel junction layer is negligible.

FIG. 4 also shows that, in a light-emitting device that generates light having a wavelength of 1.3 µm, absorption can be eliminated by using GaAsSb with an antimony fraction of less than about 0.31 as the material of p-type tunnel junction layer 306. GaAsSb with an antimony fraction of 0.31, i.e., GaAs$_{0.69}$Sb$_{0.31}$, has a lattice mismatch of approximately 1.34% with an n-type tunnel junction layer 304 of InP. The critical thickness corresponding to a lattice mismatch of approximately 1.34% is greater than 20 nm. Growing the p-type tunnel junction layer with a thickness less than the critical thickness will avoid dislocations and provide material having a high optical quality.

In another example, GaAsSb with an antimony fraction of 0.37, i.e., $GaAs_{0.63}Sb_{0.37}$, and a thickness of 80 nm is suitable for use as the material of p-type tunnel junction layer 306 in light-emitting devices that generate light in the ITU-standardized wavelength range that includes 1.55 μm. This material can be grown pseudomorphically on n-type tunnel junction layer 304 of InP by MOCVD at growth temperatures between 530° C. and 620° C. High resolution X-ray diffraction reveals that a p-type tunnel junction layer grown as just described has good crystalline quality and that there is little strain relaxation.

In another example, gallium arsenide antimonide with an antimony fraction of 0.49, i.e., $GaAs_{0.51}Sb_{0.49}$, is lattice matched to InP. A fraction of the gallium atoms in $GaAs_{0.51}Sb_{0.49}$ can be replaced by aluminum atoms to increase the band gap of the material. This reduces the wavelength at which absorption becomes significant.

Figure 5:
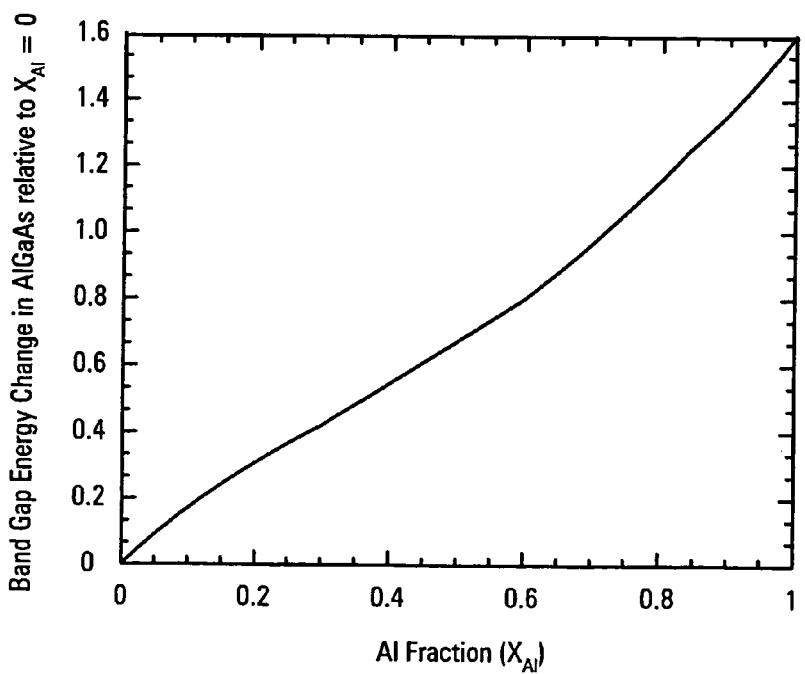
FIG. 5 is a graph illustrating the dependence on the change in the band-gap energy of AlGaAs on the Al fraction.

FIG. 5 is a graph showing the dependence of the change in band-gap energy change in aluminum gallium arsenide (AlGaAs) on the aluminum fraction $X_{Al}$ relative to the band-gap energy of GaAs, i.e., AlGaAs in which $X_{Al}=0$. This graph can be used to predict the dependence of the band-gap energy change in aluminum gallium arsenide antimonide (AlGaAsSb) on the Al fraction, $X_{Al}$. FIG. 5 indicates that replacing approximately 10% of the gallium atoms with aluminum atoms in $GaAs_{0.51}Sb_{0.49}$ increases the band-gap energy by 0.16 eV to 0.96 eV. This is greater than the band gap at which there is significant absorption at a wavelength of 1.3 μm. Thus, a tunnel junction structure in which the material of n-type tunnel junction layer 304 is InP and the material of the p-type tunnel junction layer 306 is $Al_{0.1}Ga_{0.9}As_{0.51}Sb_{0.49}$ is suitable for use in a light-emitting device that generates light at a wavelength of 1.3 μm.

A significantly larger fraction of the gallium atoms in GaAsSb may be replaced by aluminum atoms to increase the band gap of the material to one at which there is negligible absorption at such wavelengths as 850 nm and 980 nm. Such a p-type tunnel junction layer 306 is used with an n-type tunnel junction layer 304 of gallium arsenide (GaAs).

Because of the Type-II band alignment at a junction between GaAsSb and InGaAs, $Al_x(InGa)_{1-x}As$ in which the aluminum fraction x is greater than or equal to zero can also be used as the material of n-type tunnel junction layer 304 if the aluminum fraction x is chosen to minimize absorption of the light generated in the active region of the light-emitting device. However, an aluminum fraction significantly greater than that at which light absorption is prevented should be avoided to maintain the desirable small difference between the valence band energy of the material of p-type tunnel junction layer 306 and the conduction band energy of the material of n-type tunnel junction layer 304.

In another example, the material of p-type tunnel junction layer 306 is GaAsSb and the material of n-type tunnel junction layer 304 is gallium arsenide (GaAs). A tunnel junction structure may be grown using these materials on or over a substrate of gallium arsenide. Evidence of a Type-II band alignment at a junction between GaAsSb and GaAs has been observed experimentally. A theoretical fitting of experimental data also suggests a Type-II band alignment when strain deformation is taken into account. Thus, the above-described advantages of tunnel junction structures having tunnel junction layers of GaAsSb and InP can also be obtained from tunnel junction structures having tunnel junction layers of GaAsSb and GaAs. Such tunnel junction structures have the additional advantage that they can be grown on or over a substrate of GaAs. Such substrates are substantially lower in cost and are available in larger diameters than substrates of InP.

The Sb fraction is chosen to provide a band gap at which light absorption is negligible in the light-emitting device in which tunnel junction structure 302 is incorporated. An Sb fraction of less than approximately 0.31 gives negligible light absorption in light-emitting devices that generate light in the 1.3 μm wavelength range and an Sb fraction less than approximately 0.47 gives negligible light absorption in light-emitting devices that generate light in the 1.55 μm wavelength range. Again, the compositions of the materials of the tunnel junction layers can be formulated to minimize light absorption and to maintain a small band-gap energy difference between the layers to provide a high tunneling probability. In addition, light absorption can be minimized by locating the tunnel junction at a null in the electromagnetic field in the light-emitting device. Regardless of the method chosen for reducing light absorption, the thickness of the layers is made smaller than the critical thickness to achieve good crystalline and, hence, good optical, quality.

Figure 6A:
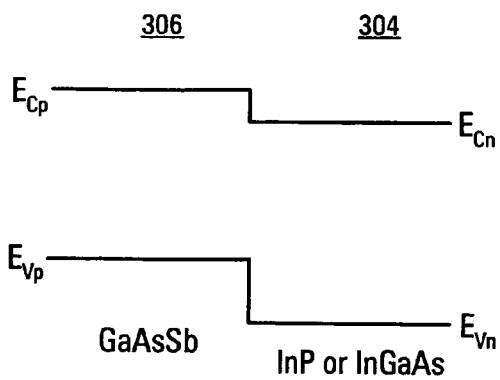
FIG. 6A is a graph illustrating the Type-II band alignment of a tunnel junction structure according to the invention in which the materials of the n-type and p-type tunnel junction layers are n-type InP or n-type InGaAs and p-type GaAsSb, respectively.

FIG. 6A shows the Type-II band alignment in an embodiment of tunnel junction structure 302 in which the material of p-type tunnel junction layer 306 is GaAsSb and that of n-type tunnel junction layer 304 is InP or InGaAs. This combination of materials has a Type-II band alignment in which the conduction band energy $E_{Cp}$ of the material of the p-type tunnel junction layer is greater than the conduction band energy $E_{Cn}$ of the material of the n-type tunnel junction layer. Additionally, the valence band energy $E_{Vp}$ of the material of p-type tunnel junction layer is greater than the valence band energy $E_{Vn}$ of the material of the n-type tunnel junction layer. The Type-II band alignment reduces reverse-bias voltage required for significant electron tunneling to occur. A Type-II band alignment is achieved by selecting the compositions of the materials of the n-type and p-type tunnel junction layers 304 and 306, respectively. The compositions of the materials of the tunnel junction layers may additionally be selected to minimize light absorption and to provide a low band-gap energy difference.

In the embodiments described above, a fraction of the arsenic atoms in the (AlIn)GaAs of p-type tunnel junction layer 306 is replaced by antimony atoms. This substitution increases the valence band energy of the material of the p-type tunnel junction layer. This increase reduces the difference between the valance band energy of the material of the p-type tunnel junction layer and the conduction band energy of the material of n-type tunnel junction layer 304. The reduction in the energy difference increases the probability of tunneling and the conductivity of the tunnel junction structure. The tunnel junction materials in above embodiments additionally typically have a Type-II band alignment.

In the embodiments to be described next, a fraction of the arsenic atoms in the (AlIn)GaAs of n-type tunnel junction layer 304 is replaced by nitrogen atoms. This substitution decreases the conduction band energy of the material of the n-type tunnel junction layer. This decrease reduces the difference between the valance band energy of the material of the p-type tunnel junction layer and the conduction band energy of the material of the n-type tunnel junction layer, and provides the beneficial results just described above. Not all of the tunnel junction materials in the following embodiments additionally have a Type-II band alignment.

For example, in an embodiment, the material of n-type tunnel junction layer 304 is n-type gallium arsenide nitride (GaAsN). It has been shown that substituting a small fraction of the arsenic atoms in GaAs with nitrogen atoms significantly reduces the band gap energy of the material. Most of the reduction in the band gap energy is the result of a reduction in the conduction band energy. As an example, substituting 1% of the arsenic atoms with nitrogen atoms reduces the conduction band energy by about 150 meV.

In an embodiment in which the material of n-type tunnel junction layer 304 is GaAsN, the material of p-type tunnel junction layer 306 is p-type GaAsSb. This combination of materials has a Type-II band alignment.

In other embodiments, the material of n-type tunnel junction layer 304 is $In_wGa_{1-w}As_{1-x}N_x$ in which $w \geq 0$ and $x \leq 0.15$ and the material of p-type tunnel junction layer 306 is $In_yGa_{1-y}As_{1-z}Sb_z$ in which $y \geq 0$ and $z \geq 0$. In some of these embodiments, for example, ones in which materials of the n-type and p-type tunnel junction layers are GaAsN (x=0) and GaAs (y=0, z=0), respectively, the materials of the n-type tunnel junction layer and the p-type tunnel junction layer have the same valence band energy but differ in their conduction band energies.

Figure 6B:
FIG. 6B is a graph illustrating the band alignment of a tunnel junction structure according to the invention in which the materials of the n-type and p-type tunnel junction layers are n-type GaAsN and p-type GaAs, respectively.

FIG. 6B shows the band alignment in an embodiment of tunnel junction structure 302 in which the material of p-type tunnel junction layer 306 is GaAs and that of n-type tunnel junction layer 304 is GaAsN. The conduction band energy $E_{Cp}$ of the material of the p-type tunnel junction layer is greater than the conduction band energy $E_{Cn}$ of the material of the n-type tunnel junction layer, and the valence band energy $E_{Vp}$ of the material of p-type tunnel junction layer is approximately equal to the valence band energy $E_{Vn}$ of the material of the n-type tunnel junction layer. The band alignment shown in FIG. 6B is therefore not a strict Type-II band alignment. However, this band alignment produces the benefits described above.

Figure 6C:
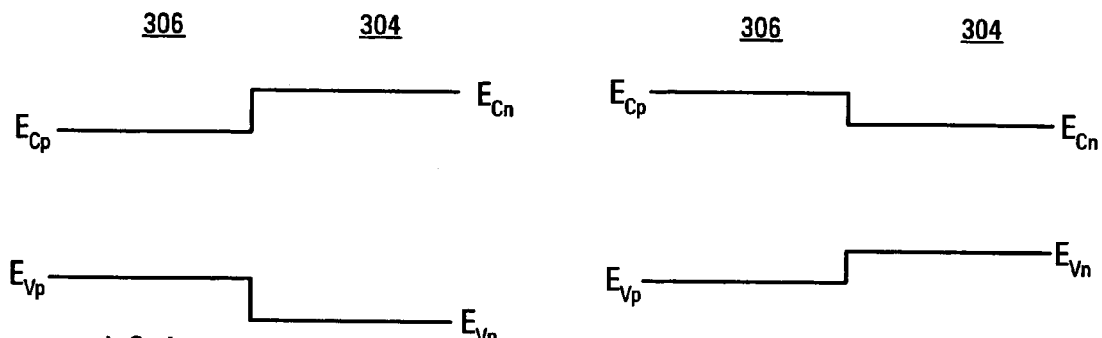
FIG. 6C is a graph illustrating the band alignment of a tunnel junction structure according to the invention in which the materials of the n-type and p-type tunnel junction layers are n-type GaAsN and p-type InGaAs, respectively.

FIG. 6C shows the effect of replacing a fraction of the gallium atoms in the GaAs of p-type tunnel junction layer 306 with indium atoms on the band alignment shown in FIG. 6B. Replacing a fraction of the gallium atoms in GaAs with indium atoms increases the valence band energy and reduces the conduction band energy relative to GaAs. Therefore, the conduction band energy $E_{Cp}$ of the material of the p-type tunnel junction layer is less than the conduction band energy $E_{Cn}$ of the material of the n-type tunnel junction layer, and the valence band energy $E_{Vp}$ of the material of p-type tunnel junction layer is greater than the valence band energy $E_{Vn}$ of the material of the n-type tunnel junction layer. The energy-band alignment shown reduces reverse-bias voltage required for significant electron tunneling to occur.

Figure 6D:
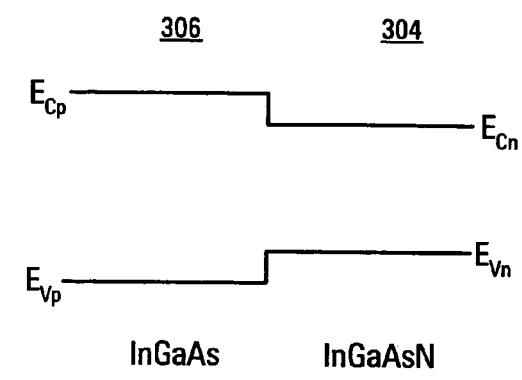
FIG. 6D is a graph illustrating the band alignment of a tunnel junction structure according to the invention in which the materials of the n-type and p-type tunnel junction layers are n-type InGaAsN and p-type InGaAs, respectively.

FIG. 6D shows the effect of replacing a fraction of the gallium atoms in the GaAsN of n-type tunnel junction layer 304 with indium atoms on the band alignment shown in FIG. 6C. The fraction of indium atoms in n-type tunnel junction layer 304 is greater than the fraction of indium atoms in p-type tunnel junction layer 306. Replacing a fraction of the gallium atoms in the GaAsN of the n-type tunnel junction layer with indium atoms increases the valence band energy and reduces the conduction band energy relative to GaAsN. Therefore, the conduction band energy $E_{Cp}$ of the material of the p-type tunnel junction layer is greater than the conduction band energy $E_{Cn}$ of the material of the n-type tunnel junction layer, and the valence band energy $E_{Vp}$ of the material of p-type tunnel junction layer is less than the valence band energy $E_{Vn}$ of the material of the n-type tunnel junction layer. The energy-band alignment shown reduces reverse-bias voltage required for significant electron tunneling to occur. An embodiment in which the fraction of indium atoms in n-type tunnel junction layer 304 is less than the fraction of indium atoms in p-type tunnel junction layer 306 has a Type-II band alignment similar to that shown in FIG. 6A.

Figure 7:
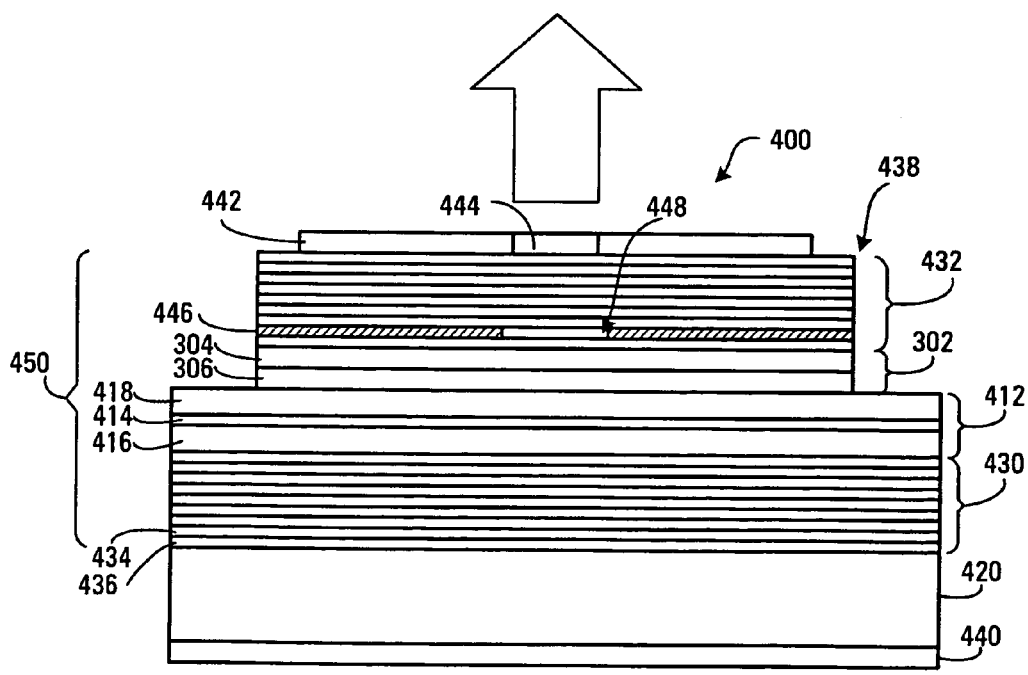
FIG. 7 is a schematic side view of a first embodiment of a vertical-cavity surface-emitting laser according to the invention.

Two exemplary light-emitting devices incorporating the tunnel junction structure of the invention will now be described with reference to FIGS. 7 and 8. FIG. 7 is a schematic side view of a VCSEL 400 composed of a substrate-side distributed Bragg reflector (DBR) 430, an active layer 412, tunnel junction structure 302 and a remote-side DBR 432, epitaxially grown, in order, on a substrate 420. In a preferred embodiment, the semiconductor material of the substrate is single-crystal gallium arsenide. The structure shown in FIG. 7 may alternatively be grown with changes to the materials of some of the layers on an InP substrate.

Each of DBRs 430 and 432 is composed of multiple layer pairs. Each layer pair is composed of a layer of a high refractive index material and a layer of a low refractive index material. The materials of the layers are optically transparent at the wavelength of the light generated in active region 412. Exemplary layer 434 of higher refractive index material and layer 436 of lower refractive index material constituting an exemplary layer pair of substrate-side DBR 430 are shown. Each layer has a thickness equal to one-quarter of the wavelength of the light generated in active region 412 in the material of the layer, i.e., $t_b = \lambda/4n_b$, where $t_b$ is the thickness of the layer, $\lambda$ is the in vacuo wavelength of the light generated in the active region and $n_b$ is the refractive index of the material of the layer.

In the example shown, both DBR 430 and DBR 432 are fabricated of doped semiconductor materials and are therefore electrically conductive. In embodiments incorporating non-conductive DBRs, such DBRs may be fabricated from dielectric materials. Also in the example shown, the lower refractive index semiconductor material of layer 436 is aluminum gallium arsenide and the higher refractive index semiconductor material of layer 434 is gallium arsenide. The number of layer pairs shown in FIG. 7 is substantially reduced to simplify the drawing. In a working VCSEL, the number of layer pairs is sufficient to provide substrate-side DBR 430 and remote-side DBR 432 with a reflectivity of greater than about 99% and of about 95%, respectively, at the wavelength of the light generated in active region 412. Also, in addition to the layer pairs, each of the DBRs is composed of an additional layer of low refractive index material.

Active layer 412 is composed of quantum-well structure 414 sandwiched between the substrate-side cladding layer 416 and the remote-side cladding layer 418. The quantum-well structure is composed of at least one quantum-well layer (not shown) sandwiched between respective barrier layers (not shown) of a material different from that of the quantum well layer. No dopants are added to the materials of the active layer when the active layer is grown.

Substrate-side cladding layer 416 and the remote-side cladding layer 418 are layers of aluminum gallium arsenide (AlGaAs) with an aluminum fraction in the range from about 0.2 to about 0.8, i.e., ~0.2 $\leq$ x $\leq$ ~0.8 in $Al_xGa_{1-x}As$. A typical value of x is about 0.4. The cladding layers each have a minimum thickness corresponding to one wavelength of the light generated in quantum-well structure 414 in the material of the cladding layer, i.e., $t_c = \lambda/n_c$, where $t_c$ is the thickness of the cladding layer, $\lambda$ is the wavelength of the light generated in the quantum-well structure and $n_c$ is the refractive index of the AlGaAs of the cladding layer. The cladding layers are doped to have opposite conductivity types. The substrate-side cladding layer 416 is doped n-type and the remote-side cladding layer 418 is doped p-type.

In a conventional VCSEL, the semiconductor materials of the substrate-side DBR are doped n-type and those of the remote-side DBR are doped p-type, i.e., the materials of the DBRs have the same conductivity type as the adjacent cladding layers. The DBR fabricated of p-type materials has characteristics inferior to those of the DBR fabricated of n-type materials, as described above. However, tunnel junction structure 302 enables the semiconductor materials of both DBRs 430 and 432 to have the same conductivity type as one another, i.e., n-type, so that both DBRs have excellent optical and electrical characteristics.

Substrate-side DBR 430, active region 412, tunnel junction structure 302 and remote-side DBR 432 collectively form an optical cavity 450 that is resonant at the wavelength of the light generated in active layer 412.

In tunnel junction structure 302, p-type tunnel junction layer 306 is composed of GaAsSb and is grown on remote-side cladding layer 418. N-type tunnel junction layer 304 is composed of GaAs grown lattice matched or pseudomorphically on the p-type tunnel junction layer. Alternatively, p-type tunnel junction layer 306 may be composed of (In)GaAs and n-type tunnel junction layer 304 may be composed of (In)GaAsN grown on the p-type tunnel junction layer.

After the layer structure composed of substrate 420 substrate-side DBR 430, active layer 412, tunnel junction structure 302 and remote-side DBR 432 has been fabricated, part of remote-side DBR 432 and part of tunnel junction structure 302 are etched away to form mesa 438. A current confinement structure is formed in the mesa. For example, ions may be selectively implanted into the mesa to decrease the conductivity of the mesa in all but a small, substantially central, conductive region. The conductivity of the mesa remains substantially unchanged in the conductive region.

In the example shown, however, the current-confinement structure is formed by exploiting the dependence of the oxidation rate of AlGaAs on the aluminum fraction of the AlGaAs. When remote-side DBR 432 is grown, at least one of the layers of AlGaAs is grown with an aluminum fraction substantially higher than that of the remaining layers of AlGaAs. For example, the high-aluminum fraction layer may have an aluminum fraction greater than about 0.9 when the remaining layers of AlGaAs have an aluminum fraction of in the range from about 0.75 to about 0.85. An exemplary high-aluminum fraction AlGaAs layer is shown at 446. After mesa 438 has been formed, the VCSEL is heated in an oxidizing atmosphere, such as an atmosphere with a high water vapor content. The oxidizing atmosphere oxidizes the exposed areas of all the layers of AlGaAs, the oxidation progressing radially inwards from the side of the mesa. However, oxidation progresses substantially faster in the high-aluminum fraction AlGaAs layer 446 than in the remaining AlGaAs layers. At the end of the oxidation process, almost all the high-aluminum fraction AlGaAs layer is oxidized to form a wide annular region of aluminum oxide surrounding a conductive region 448. Aluminum oxide has a substantially lower electrical conductivity than doped AlGaAs. The high-aluminum AlGaAs remains unoxidized in conductive region 448 so that the optical and electrical properties of the conductive region remain substantially unchanged. The remaining AlGaAs layers are oxidized only in a narrow annular region at their peripheries.

The area of the conductive region, e.g., 448, defined by ion implantation, oxidation or otherwise, is small compared with that of the mesa 438. During operation of the VCSEL 400, the laser current is confined to the conductive region, where it achieves a very high current density. The laser current enters active region 412 from the conductive region. Current spreading is relatively small so that the current density is also very high in the active region. The very high current density lowers the threshold current of the VCSEL. In an alternative embodiment, the oxide current confinement structure just described is located between tunnel junction structure 302 and active region 412.

A substrate-side contact layer 440, composed of at least one layer of metal, is deposited on the surface of the substrate 420 remote from substrate-side DBR 430. A remote-side contact layer 442 is deposited on the exposed surface of remote-side DBR 432 and is patterned to define a light exit port 444. The light exit port is radially aligned with conductive region 448. The remote-side contact layer is composed of at least one layer of metal, and may additionally include at least one layer of n-type semiconductor material having a high dopant concentration to reduce the contact resistance between the metal layer and remote-side DBR 432.

Figure 8:
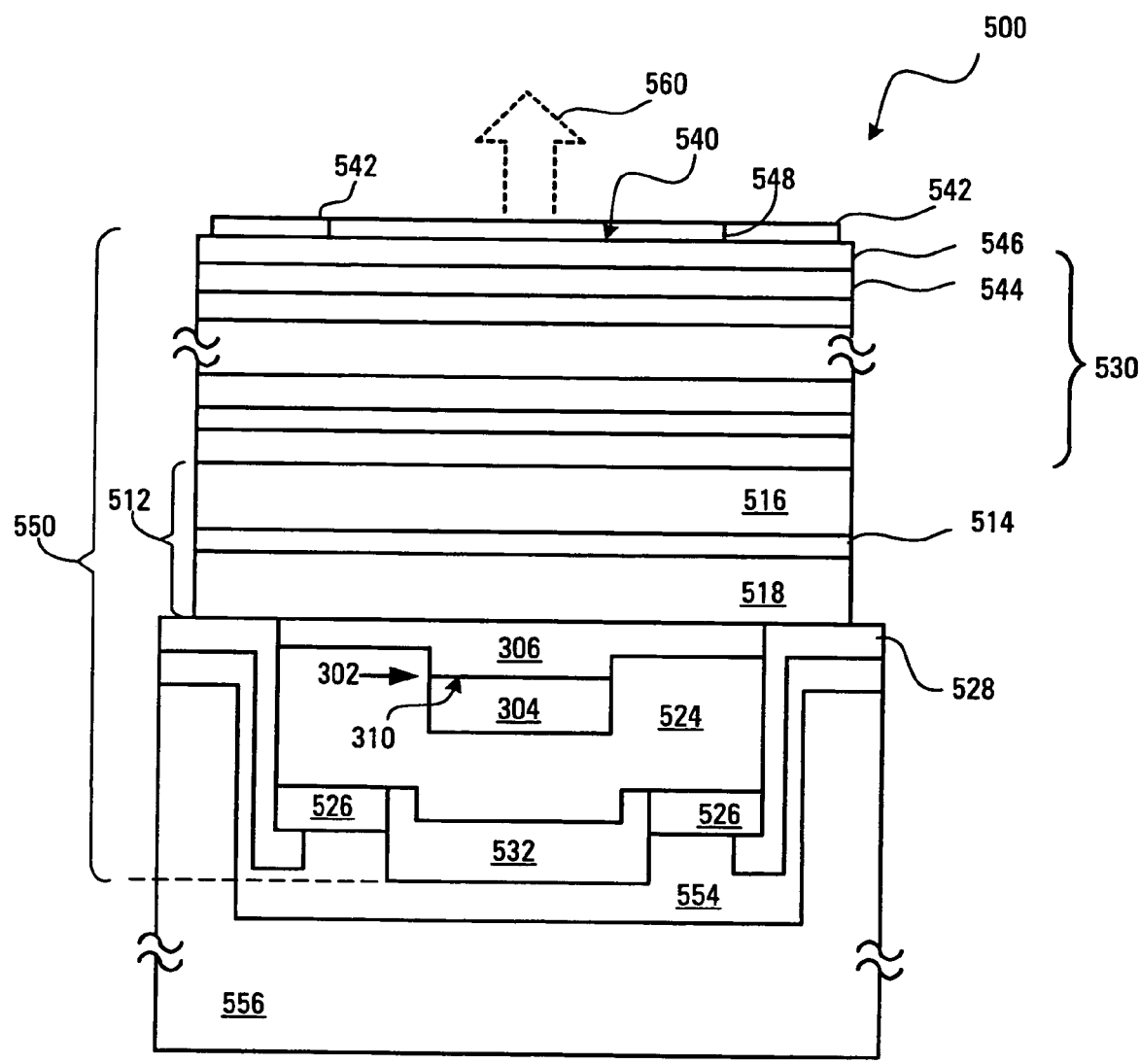
FIG. 8 is a schematic cross-sectional view of a second embodiment of a vertical-cavity surface-emitting laser according to the invention.

FIG. 8 is a schematic cross-sectional view of a second embodiment 500 of a VCSEL incorporating tunnel junction structure 302 according to the invention. VCSEL 500 emits light 560 from a surface 540 through an aperture 548 in a cathode contact 542. Tunnel junction structure 302 is structured to concentrate current and to inject carriers directly into the portion of active region 512 underlying aperture 548.

VCSEL 500 is composed of a semiconductor distributed Bragg reflector (DBR) 530, an active region 512, tunnel junction structure 302, a cap layer 524 and a dielectric DBR 532. Semiconductor DBR 530 is composed of pairs of layers of semiconductor materials having high and low refractive indices and an additional layer of the low refractive index semiconductor material. An exemplary layer pair composed of layer 544 and layer 546 is shown. Layer 544 is a layer of indium gallium aluminum arsenide (e.g., $In_{0.53}Ga_{0.37}Al_{0.10}As$). Layer 546 is a layer of indium aluminum arsenide (e.g., $In_{0.52}Al_{0.48}As$). The thickness of each layer is equal to ¼ of the wavelength of the light generated in active region 512 divided by the refractive index of the material of the layer, as described above. The remaining layer pairs of semiconductor DBR 530 are similar. The materials of semiconductor DBR 530 are doped n-type. For example, the materials of semiconductor DBR 530 may be doped with silicon (Si) at a concentration of $2 \times 10^{18}$ cm$^3$. Seventeen and one-half layer pairs of the materials described above give semiconductor DBR 530 a reflectivity of about 99.7%.

Active region 512 is composed of cladding layer 516, cladding layer 518 and quantum well region 514 sandwiched between the cladding layers. Cladding layer 516 is a layer of n-type indium aluminum arsenide (InAlAs). Quantum well region 514 is composed of compressively-strained (1.6%) quantum well layers separated by tensile-strained (0.4%) barrier layers. The quantum well layers are layers of indium gallium aluminum arsenide (InGaAlAs). Alternatively, region 514 may be formed of a material with integrated quantum dots. Cladding layer 518 is a layer of p-type indium aluminum arsenide (InAlAs).

Tunnel junction structure 302 is located between cladding layer 518 and cap layer 524. Tunnel junction 310 is positioned at a minimum of the electromagnetic field intensity distribution in VCSEL 500 to minimize light absorption by tunnel junction structure 302. In the example shown, the material of p-type tunnel junction layer 306 is GaAsSb and the material of n-type tunnel junction layer is InP. N-type tunnel junction layer 304 and p-type tunnel junction layer 306 form tunnel junction 310. The antimony fraction of the material of the p-type tunnel junction layer is approximately 0.49. $GaAs_{0.51}Sb_{0.49}$ grows lattice matched to the InP of the n-type tunnel junction layer. The $GaAs_{0.51}Sb_{0.49}$ and InP that constitute the tunnel junction layers of tunnel junction structure 302 have a Type-II band alignment and differ in conduction band energy by 0.18–0.23 eV.

In the example shown, tunnel junction 310 has an area substantially less than that of quantum well region 514. P-type tunnel junction layer 306 is located adjacent cladding layer 518. N-type tunnel junction layer 304 and part of p-type tunnel junction layer 306 are located adjacent cap layer 524. The material of cap layer 524 is n-type InP having a dopant concentration substantially less than that of n-type tunnel junction layer. Consequently, most of the current flowing from cap layer 524 to p-type tunnel junction layer 306 flows through n-type tunnel junction layer 304. The current flows into the active region, where it remains concentrated in a region substantially corresponding to the area of tunnel junction 310. This provides a high current density in the portion of the active region underlying aperture 548.

Alternatively, the material of cap layer 524 may be n-type InGaAs or another suitable semiconductor material.

Dielectric DBR 532 covers a part of cap layer 524 axially aligned with tunnel junction 310. In the example shown, the dielectric DBR is composed of a layer of silicon (Si) sandwiched between two layers magnesium fluoride ($MgF_2$). Dielectric DBR 532 has a reflectivity of approximately 99.5% as a result of the large refractive index contrast (approximately 1.9) between its constituent materials.

Contact layer 526, which contacts cap layer 524, surrounds dielectric DBR 532. The material of contact layer 526 is n-type InGaAs.

Insulating layer 528 covers an outer annular region of contact layer 526 radially separated from dielectric DBR 532 and covers the sides of the contact layer, cap layer 524 and p-type tunnel junction layer 306. The material of insulating layer 528 is silicon nitride ($Si_3N_4$).

Anode contact 554 covers dielectric mirror 532 and the exposed part of contact layer 526 not covered by insulating layer 528. The anode contact additionally covers insulating layer 528. Thus, anode contact 554 makes electrical contact with contact layer 526. The material of anode contact is gold (Au).

Cathode contact 542, also of gold, covers an annular region on surface 540 of semiconductor DBR 530. Defined in cathode contract 542 is aperture 548 through which light generated in active region 512 is emitted.

VCSEL 500 is shown mounted in heatsink 556. The material of heatsink 556 is silver (Ag).

VCSEL 500 is fabricated by first epitaxially growing on an InP wafer a layer structure from which many VCSELs, including VCSEL 500, are made. The layer structure is grown by MOCVD. Other suitable growth processes may alternatively be used. Layers corresponding to semiconductor DBR 530, n-type cladding layer 516, quantum well region 514, p-type cladding region 518, p-type tunnel junction layer 306 and n-type tunnel junction layer 304 of VCSEL 500 are grown, in order, on the wafer. For convenience, the layers of the layer structure will be called by the names of the corresponding layers of VCSEL 500. N-type tunnel junction layer is grown at a growth temperature in the range from 500° C.–600° C. As no aluminum precursor is used to grow this layer, the oxygen level in the layer can be as low as $10^{16}$ $cm^{-3}$.

The layer structure is then removed from the reactor, and a mask that defines the shape of n-type tunnel junction layer 304 of each VCSEL is applied to the exposed surface of the n-type tunnel junction layer. An etch process is performed using an etchant that etches the material of not only the n-type tunnel junction layer not protected by the mask but also the material of p-type tunnel junction layer 306 exposed by removal of the n-type tunnel junction layer. The etching process is timed such that only part of p-type tunnel junction layer is removed.

The layer structure is then returned to the reactor and cap layer 524 is regrown over the contoured surface of tunnel junction structure 302. The layers constituting dielectric DBR 532 are then deposited over cap layer 524.

The layer structure is then removed from the reactor, a mask is applied to the surface of the exposed surface of the dielectric DBR and the parts of the dielectric DBR not protected by the mask are etched until the underlying parts of the surface of cap layer 524 are exposed.

The layer structure is then returned to the reactor and contact layer 526 is regrown over the contoured surfaces of dielectric DBR 532 and cap layer 524. The layer structure is then removed from the reactor, a mask is applied to the surface of the contact layer and the parts of the contact layer not protected by the mask are etched until the underlying parts of the surface of dielectric mirror 532 are exposed.

The layer structure is placed in a nitride deposition reactor and silicon nitride is deposited over the contoured surface of the layer structure to form insulating layer 528. The layer structure is then removed from the reactor, a mask is applied to the exposed surface of the insulating layer and the parts of the insulating layer not protected by the mask are etched until the underlying parts of the surface of contact layer 526 are exposed.

The layer structure is etched to remove the InP wafer. This exposes surface 540 of semiconductor DBR 530. The layer structure is placed in a metallization reactor, and a layer of gold is deposited on the exposed surfaces of contact layer 526 and passivation layer 528 to form anode contact 554 and on surface 540 to form a cathode contact layer. A mask is applied to the surface of the cathode contact layer and the parts of the cathode contact layer not protected by the mask are etched until the underlying parts of surface 540 are exposed. This defines the shape of cathode contact 542.

Finally, the layer structure is divided into individual VCSELs, including VCSEL 500. Each individual VCSEL may then be mounted in a heatsink, such as heatsink 556. More details of the above fabrication method can be found in Ortsiefer et al., *Low-Resistance InGa(Al)As Tunnel Junctions for Long Wavelength Vertical-Cavity Surface-Emitting Lasers*, 39 JPN. J. APPL. PHYS., 1727–1729 (2000), the entire disclosure of which is incorporated by reference.

VCSEL 500 is operated by passing current from anode electrode 554 to cathode electrode 542. The current passes through contact layer 526, cap layer 524, tunnel junction structure 302, active region 512 and semiconductor DBR 530. The current passing into active region 512 is confined to an area underlying aperture 548. This area substantially corresponds to that of tunnel junction 310, as the lower doping concentration in cap layer 524 results in negligible tunneling current flowing between the cap layer and p-type tunnel junction layer 306.

The current causes active layer 512 to generate light. With the appropriate choice of materials and thicknesses, the light is generated at a wavelength in the wavelength range from 1.3 µm to 1.6 µm, which covers the ITU-standardized wavelengths for long- and medium-haul optical communication applications.

Tunnel junction structure 302 described above with reference to FIGS. 3–7 may be incorporated into other light-emitting devices, including light-emitting diodes and other lasers known in the art, such as, but not limited to, quantum-cascade lasers, edge-emitting lasers, and in-plane emitting lasers. Tunnel junction structure 302 may also be incorporated into non light-emitting semiconductor devices such as tunnel diodes. A tunnel diode incorporating tunnel junction structure 302 has a very high negative differential resistance in the forward direction. This characteristic is desirable in such applications as oscillators, oscilloscope trigger circuits and solar cells.

An example of a method according to the invention for making a tunnel junction structure and for generating light will now be described below with reference to FIGS. 9 and 10. In the descriptions of the methods, it should be understood that although particular stages in the processes are described, alternative implementations are feasible. Moreover, some processes may be executed in an order different from that shown. For examples, processes may be executed substantially concurrently or in reverse order.

Figure 9:
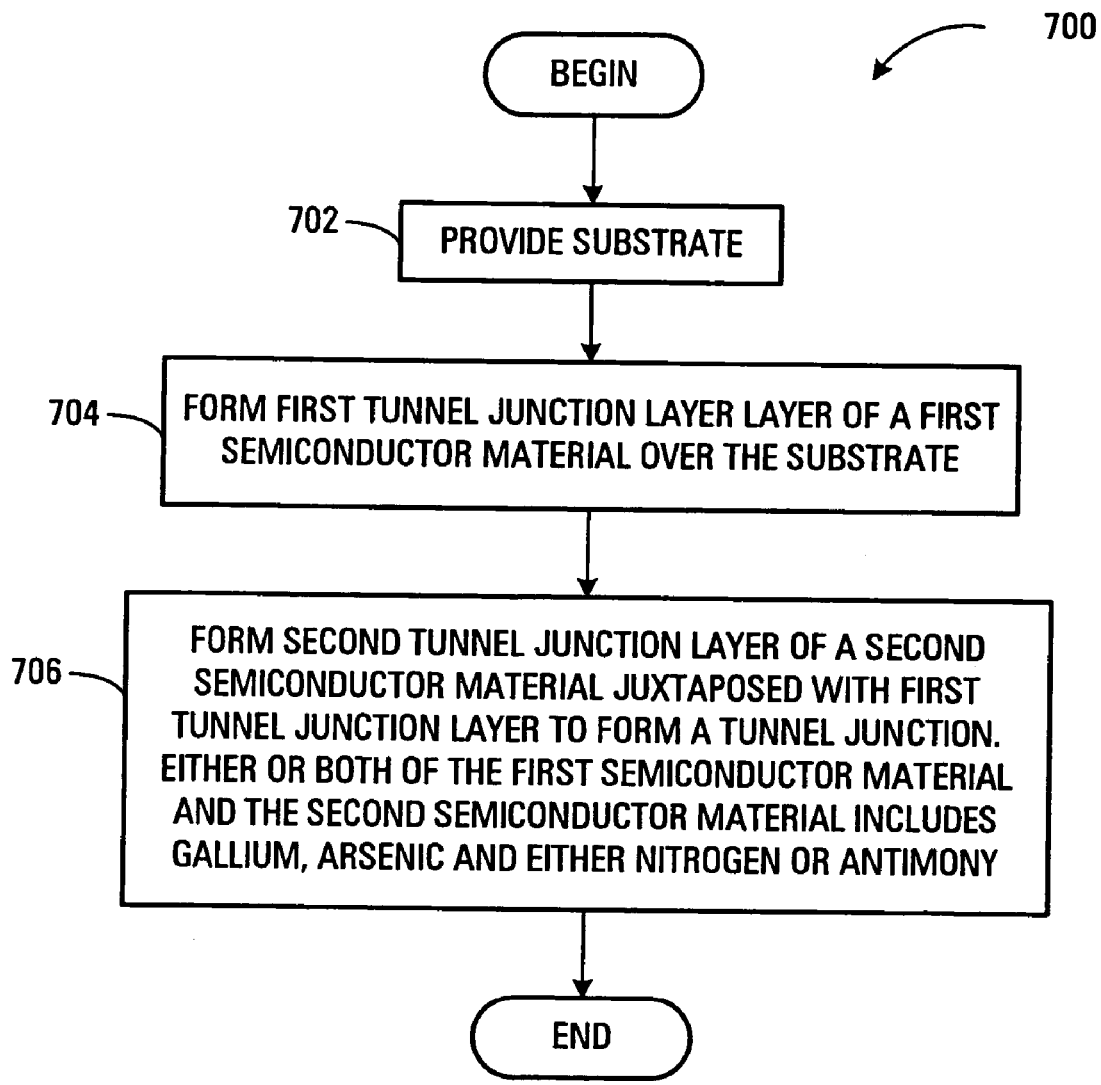
FIG. 9 is a flow chart illustrating a method according to the invention for making a tunnel junction structure.

FIG. 9 illustrates a method 700 according to the invention for making a tunnel junction structure. In block 702 a substrate is provided. In block 704, an n-type tunnel junction layer of a first semiconductor material is formed over the substrate. This can be accomplished by depositing a layer of the first semiconductor material over or on the substrate. Alternatively a portion of the substrate may be doped with an impurity to form the n-type tunnel junction layer. In block 706, a p-type tunnel junction layer of a second semiconductor material is formed juxtaposed to the n-type tunnel junction layer. The n-type tunnel junction layer and the p-type tunnel junction layer collectively form the tunnel junction. Either or both of the first semiconductor material and the second semiconductor material includes gallium (Ga), arsenic (As) and either nitrogen (N) or antimony (Sb).

Either the n-type tunnel junction layer or the p-type tunnel junction layer can be grown lattice-matched or pseudomorphically or otherwise applied to the juxtaposed layer. Layers of additional materials may be grown or otherwise applied upon the tunnel junction layer remote from the substrate.

Figure 10:
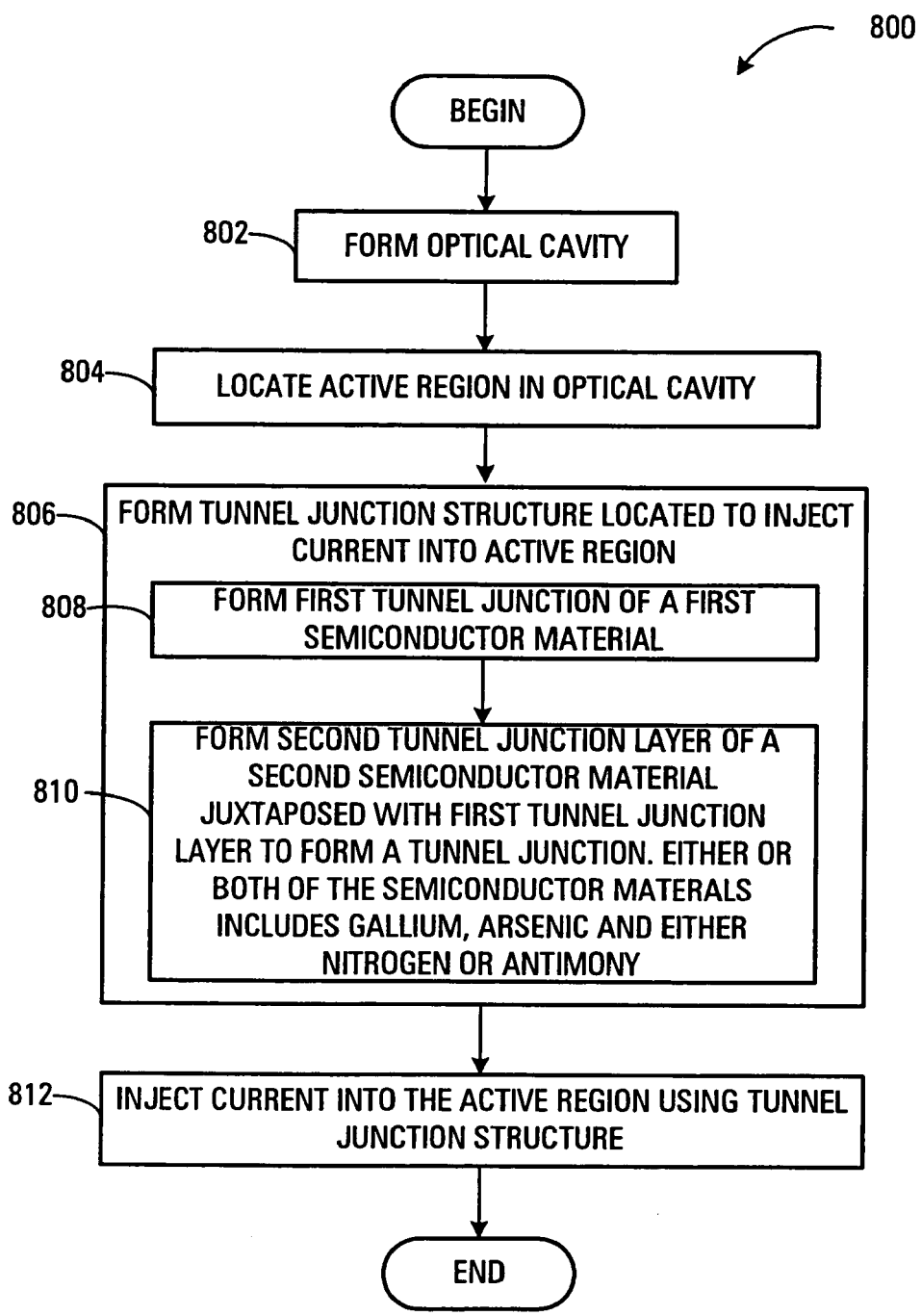
FIG. 10 is a flow chart illustrating a method according to the invention for generating light.

FIG. 10 illustrates a method 800 according to the invention for generating light. In block 802, an optical cavity is formed. In block 804, an active region is located in the optical cavity. In block 806, a tunnel junction structure is formed located to inject current into the active region. Block 806 includes blocks 808 and 810. In block 810, an n-type tunnel junction layer of a first semiconductor material is formed. In block 812, a p-type tunnel junction layer of a second semiconductor material is formed juxtaposed with the n-type tunnel junction layer to form a tunnel junction. Either or both of the first semiconductor material and the second semiconductor material includes gallium (Ga), arsenic (As) and either nitrogen (N) or antimony (Sb). In block 812, current is injected from the tunnel junction structure into the active region to cause the active region to generate light.

In the methods described above, the semiconductor material that includes gallium, arsenic and antimony is the material of the p-type tunnel junction layer. The semiconductor material that includes gallium, arsenic and nitrogen is the material of the n-type tunnel junction layer. In an embodiment, the semiconductor material of the p-type tunnel junction layer includes gallium, arsenic and antimony and the semiconductor material of the n-type tunnel junction layer includes gallium, arsenic and nitrogen.

This disclosure describes the invention in detail using illustrative embodiments. However, it is to be understood that the invention defined by the appended claims is not limited to the precise embodiments described.

We claim:

1. A light-emitting device, comprising:
   an active region configured to generate light in response to injected charge; and
   a tunnel junction structure located to inject charge into the active region and including A p-type tunnel junction layer of a first semiconductor material, an n-type tunnel junction layer of a second semiconductor material and a tunnel junction between the tunnel junction layers, at least one of the semiconductor materials including gallium (Ga), arsenic (As) and one of nitrogen (N) and antimony (Sb).

2. The light-emitting device of claim 1, in which the n-type tunnel junction layer is located between the p-type tunnel junction layer and the active region.

3. The light-emitting device of claim 1, in which the p-type tunnel junction layer is disposed between the n-type tunnel junction layer and the active region.

4. The light-emitting device of claim 1, in which the semiconductor material of the n-type tunnel junction layer includes gallium, arsenic and nitrogen.

5. The light-emitting device of claim 4, in which the semiconductor material of the n-type tunnel junction layer consists essentially of indium gallium arsenide nitride $In_xGa_{1-x}AsN$ in which $x \geq 0$.

6. The light-emitting device of claim 1, in which the semiconductor material of the p-type tunnel junction layer includes gallium, arsenic and antimony.

7. The light-emitting device of claim 6, in which:
   the semiconductor material of the p-type tunnel junction layer consists essentially of indium gallium arsenide antimonide $In_xGa_{1-x}AsSb$ in which $x \geq 0$.

8. The light-emitting device of claim 1, in which the semiconductor material of the n-type tunnel junction layer consists essentially of indium phosphide (InP).

9. The light-emitting device of claim 8, in which the semiconductor material of the p-type tunnel junction layer consists essentially of gallium arsenide antimonide in which the antimony fraction is less than 0.47.

10. The light-emitting device of claim 9, in which the antimony fraction is less than 0.31.

11. The light-emitting device of claim 1, in which the semiconductor material of the p-type tunnel junction layer consists essentially of aluminum gallium arsenide antimonide $Al_xGa_{1-x}AsSb$, in which $x \geq 0$.

12. The light-emitting device of claim 1, in which the semiconductor material of the p-type tunnel junction layer consists essentially of indium gallium arsenide antimonide $In_xGa_{1-x}AsSb$, in which $x \geq 0$.

13. The light-emitting device of claim 1, in which the semiconductor material of the n-type tunnel junction layer consists essentially of indium gallium arsenide nitride $In_xGa_{1-x}AsN$, in which $x \geq 0$.

14. The light-emitting device of claim 13, in which the semiconductor material of the p-type tunnel junction layer includes gallium and arsenic.

15. The light-emitting device of claim 1, in which:
the semiconductor material of the n-type tunnel junction layer consists essentially of indium gallium arsenide nitride $In_wGa_{1-w}As_{1-x}N_x$, in which $w \geq 0$ and $x \leq 0.15$; and
the semiconductor material of p-type tunnel junction layer consists essentially of indium gallium arsenide antimonide-$In_yGa_{1-y}As_{1-z}Sb_z$ in which $y \geq 0$ and $z \geq 0$.

16. The light-emitting device of claim 15, in which:
the semiconductor material of the n-type tunnel junction layer consists essentially of indium gallium arsenide InGaAs; and
the semiconductor material of the p-type tunnel junction layer consists essentially of gallium arsenide antimonide GaAsSb.

17. The light-emitting device of claim 1, structured to generate light having a wavelength between 620 nm and 1650 nm.

18. A method of making a tunnel junction structure, the method comprising:
providing a substrate;
forming a first tunnel junction layer of a first semiconductor material over the substrate; and
forming a second tunnel junction layer of a second semiconductor material juxtaposed with the first tunnel junction layer to form a tunnel junction, at least one of the first semiconductor material and the second semiconductor material including gallium (Ga), arsenic (As), and one of nitrogen (N) and antimony (Sb).

19. The method of claim 18, in which:
one of the semiconductor materials includes gallium, arsenic and antimony; and
the method additionally comprises doping the one of the semiconductor materials p-type.

20. The method of claim 18, in which:
one of the semiconductor materials includes gallium, arsenic and nitrogen; and
the method additionally comprises doping the one of the semiconductor materials n-type.

21. A method for generating light, the method comprising:
forming an optical cavity;
locating an active region in the optical cavity, the active region configured to generate light in response to injected current;
forming a tunnel junction structure located to inject charge into the active region, including:
forming a first tunnel junction layer of a first semiconductor material, and
forming a second tunnel junction layer of a second semiconductor material juxtaposed with the first tunnel junction layer to create a tunnel junction, at least one of the first semiconductor material and the second semiconductor material including gallium (Ga), arsenic (As) and one of nitrogen (N) and antimony (Sb); and
injecting current into the active region using the tunnel-junction structure.

22. The method of claim 21, in which the active region is configured to generate light having a wavelength between 620 nm and 1650 nm.

23. A tunnel junction structure, comprising:
a p-type tunnel junction layer of a first semiconductor material;
an n-type tunnel junction layer of a second semiconductor material; and
a tunnel junction between the tunnel junction layers,
in which at least one of the semiconductor materials includes gallium (Ga), arsenic (As) and one of nitrogen (N) and antimony (Sb).

24. The tunnel junction structure of claim 23, in which the semiconductor material of the n-type tunnel junction layer includes gallium, arsenic and nitrogen.

25. The tunnel junction structure of claim 23, in which the semiconductor material of the n-type tunnel junction layer consists essentially of indium gallium arsenide nitride $In_xGa_{1-x}AsN$ in which $x \geq 0$.

26. The tunnel junction structure of claim 23, in which the semiconductor material of the p-type tunnel junction layer includes gallium, arsenic and antimony.

27. The tunnel junction structure of claim 26, in which:
the semiconductor material of the p-type tunnel junction layer consists essentially of indium gallium arsenide antimonide $In_xGa_{1-x}AsSb$ in which $x \geq 0$.

28. The tunnel junction structure of claim 23, in which the semiconductor material of the n-type tunnel junction layer consists essentially of indium phosphide (InP).

29. The tunnel junction structure of claim 28, in which the semiconductor material of the p-type tunnel junction layer consists essentially of gallium arsenide antimonide $GaAs_{1-x}Sb_x$, in which $x=0.49$.

30. The tunnel junction structure of claim 23, in which the semiconductor material of the p-type tunnel junction layer consists essentially of aluminum gallium arsenide antimonide $Al_xGa_{1-x}AsSb$, in which $x \geq 0$.

31. The tunnel junction structure of claim 23, in which the semiconductor material of the p-type tunnel junction layer consists essentially of indium gallium arsenide antimonide $In_xGa_{1-x}AsSb$, in which $x \geq 0$.

32. The tunnel junction structure of claim 23, in which the semiconductor material of the n-type tunnel junction layer consists essentially of indium gallium arsenide nitride $In_xGa_{1-x}AsN$, in which $x \geq 0$.

33. The tunnel junction structure of claim 32, in which the semiconductor material of the p-type tunnel junction layer includes gallium and arsenic.

34. The tunnel junction structure of claim 23, in which:
the semiconductor material of the n-type tunnel junction layer consists essentially of indium gallium arsenide nitride $In_wGa_{1-w}As_{1-x}N_x$, in which $w \geq 0$ and $x \leq 0.15$; and
the semiconductor material of p-type tunnel junction layer consists essentially of indium gallium arsenide antimonide $In_yGa_{1-y}As_{1-z}Sb_z$ in which $y \geq 0$ and $z \geq 0$.

35. The tunnel junction structure of claim 34, in which:
the semiconductor material of the n-type tunnel junction layer consists essentially of indium gallium arsenide (InGaAs); and
the semiconductor material of the p-type tunnel junction layer consists essentially of gallium arsenide antimonide (GaAsSb).

* * * * *